United States Patent
Bressers et al.

(10) Patent No.: US 8,227,293 B2
(45) Date of Patent: Jul. 24, 2012

(54) METHOD FOR MANUFACTURING AN ELECTRODE

(75) Inventors: Petrus Marinus Martinus Cornelus Bressers, Boxtel (NL); Marinus Marc Koetse, Eindhoven (NL); Antonius Maria Bernardus van Mol, Eindhoven (NL); Joost van Erkel, Apeldoorn (NL)

(73) Assignee: Nederlandse Organisatie Voor Toegepast-Natuurwetenschappelijk Onderzoek TNO, Delft (NL)

( * ) Notice: Subject to any disclaimer, the term of this patent is extended or adjusted under 35 U.S.C. 154(b) by 239 days.

(21) Appl. No.: 12/596,076

(22) PCT Filed: Apr. 17, 2008

(86) PCT No.: PCT/NL2008/050221
§ 371 (c)(1),
(2), (4) Date: Jan. 20, 2010

(87) PCT Pub. No.: WO2008/127111
PCT Pub. Date: Oct. 23, 2008

(65) Prior Publication Data
US 2010/0133520 A1    Jun. 3, 2010

(30) Foreign Application Priority Data
Apr. 17, 2007 (EP) ..................... 07106343

(51) Int. Cl.
*H01L 21/00* (2006.01)
*H01L 51/40* (2006.01)

(52) U.S. Cl. ............... 438/99; 438/46; 438/50; 438/82; 257/E51.001; 257/E51.026; 257/E51.003; 257/E51.012; 257/E51.018

(58) Field of Classification Search ............... None
See application file for complete search history.

(56) References Cited

U.S. PATENT DOCUMENTS

| 5,525,567 | A | 6/1996 | Chauvin et al. |
| 2003/0230973 | A1 | 12/2003 | Cheng et al. |
| 2005/0019976 | A1 | 1/2005 | Xiao et al. |
| 2006/0166474 | A1 | 7/2006 | Vereecken et al. |
| 2007/0181878 | A1* | 8/2007 | Song et al. .................. 257/59 |

FOREIGN PATENT DOCUMENTS

| JP | 11008074 | 1/1999 |
| WO | 0226381 | 4/2002 |
| WO | 03-083171 | 10/2003 |

* cited by examiner

*Primary Examiner* — Seahvosh Nikmanesh
(74) *Attorney, Agent, or Firm* — Lucas & Mercanti, LLP (57) ABSTRACT

The present invention relates to a method for manufacturing an organic electronic device, comprising providing by electro-deposition an electrode to a surface of an electro-active material—the electro-active material comprising an organic electro-active compound—or providing said electrode to a surface of a substrate for said electro-active material, after which the electro-active material is applied to a surface of the electrode, wherein the electro-deposition comprises the use of a plating liquid comprising an ionic liquid and metal or metalloid ions which metal or metalloid ions are reduced and deposited to form the electrode.

15 Claims, 3 Drawing Sheets

METHOD FOR MANUFACTURING AN ELECTRODE

This application is a 371 of PCT/NL2008/050221 filed on Apr. 17, 2008, which claims the benefit of European Patent Application No. 07106343.2 filed on Apr. 17, 2007, the contents of each of which are incorporated herein by reference.

The invention relates to a method for manufacturing an organic electronic device and to a device obtainable by such a method.

Organic electronic devices generally contain an electro-active organic layer and at least two electrode layers, which are usually metallic or transparent conductive oxides. For providing thin and/or flexible devices, it is generally desired to provide relatively thin electrode layers, preferably of about 500 nm or less. Commonly, at least one electrode (normally a cathode) consists of a highly reactive low work function metal layer (typically 5 nm) covered by a thick conductor layer (typically 100-500 nm).

In the art, these layers are generally applied using a vapour deposition technology (evaporation). Such a technology is expensive, complicated, and not generally applicable for flexible electronic devices, such as devices in the form of a foil, or at least impractical to be used on an industrial scale for such devices. Further, a general problem encountered with conventional techniques is the occurrence of pinholes in the electrode. These pinholes are an important cause of the occurrence of black spots in the device, leading to poorer quality of the device, e.g. reduced light intensity in case of a LED, reduced photo-sensitivity in case of a detector or a photo-voltaic cell (e.g. a solar cell), reduced efficiency (such as reduced conversion rate of photons to electricity in case of a photo-voltaic cell) or loss of image resolution in case the device is a device to display an image.

It is an object of the present invention to provide a novel method for manufacturing an electrode, in particular for an organic electronic device, which may serve as an alternative to known methods.

It is a further object to provide a novel method for manufacturing an organic electronic device, which may serve as an alternative to known methods.

It is further an object to provide a novel method for preparing an (electrode for an) organic electronic device which is relatively simple to be carried out on a industrial scale, in particular, to be carried out continuously.

It is further an object to provide a novel method for manufacturing an (electrode for an) organic electronic device with a low tendency, in particular, a reduced tendency of black spot formation.

One or more other objects which may be met in accordance with the invention will follow from the remainder of the description and/or the claims.

It has now been found that one or more objects are met by manufacturing an electrode using a specific deposition technique.

Accordingly, the present invention relates to a method for manufacturing an (electrode for an) organic electronic device, comprising providing an electrode to a surface of an electro-active material—the electro-active material comprising an organic electro-active compound—by electro-deposition, using a plating liquid comprising an ionic liquid and metal or metalloid ions which metal or metalloid ions are reduced and deposited to form an electrode.

Optionally, the metallic or metalloid layer is further oxidised to form a conductive oxide, e.g. a layer comprising indium and tin may be oxidised to form an indium-tin conductive oxide (ITO).

Further, the present invention relates to a method for manufacturing an (electrode for an) organic electronic device, comprising providing an electrode to the surface of a substrate for an electro-active material, after which the electro-active material is applied to a surface of the electrode—by electro-deposition, using a plating liquid comprising an ionic liquid and metal or metalloid ions which metal or metalloid ions are reduced and deposited to form the electrode.

The term "or" as used herein means "and/or" unless specified other wise.

The term "a" or "an" as used herein means "at least one" unless specified other wise.

The term "electro-active" is used herein for a material which is capable of converting a non-electric form of energy into electric energy or vice versa. Thus an electro-active material may be capable of converting mechanical energy or electromagnetic radiation (such as UV, visible light or IR) into electrical energy or transferring electrical energy into mechanical energy or electromagnetic radiation. In particular an electro-active material is capable of acting as a (semi-)conductor for electrical energy.

When referring to a moiety (e.g. a compound, an ion, an additive etc.) in singular, the plural is meant to be included. Thus, when referring to a specific moiety, e.g. "ion", this means "at least one" of that moiety, e.g. "at least one ion", unless specified otherwise.

The invention allows providing an electrode with satisfactory properties or even one or more improved properties, such as a low tendency of pinhole formation, uniform electrode-thickness, a low surface roughness, good reflectivity and/or a highly continuous coverage of the surface that is to be covered. In an embodiment, an electrode is provided with a low number of black spots, as may be visually be determined, e.g. under a scanning electron microscope, and in particular in case of a LED under a light microscope or at least in some circumstances by the naked eye.

In particular, the present invention is suitable to provide an organic (opto-)electronic device comprising an electrode with a highly homogenous and/or smooth surface. In particular, the number of crystal defects in the surface of the electrode may be $10^6/m^2$ or less, or $10^5/m^2$ or less. The number of such defects can be determined by scanning electron microscopy (SEM).

In an embodiment, the electrode has a low permeability to a gaseous, vaporous or liquid component, such as water. For instance, the permeability to water may be less than $10^{-6}$ g water/m²/day. The permeability may be determined as described in US2006/147346.

The invention allows the formation of an electrode with satisfactory properties within a wide thickness range. The thickness may suitably be determined with a profilometer. The thickness may in particular be at least 1 nm, at least 10 nm, at least 50, at least 100 nm or at least 200 nm. The thickness may in particular be up to 100 µm, up to 10 µm, up to 1 µm, up to 500 nm, up to 200 nm, up to 100 nm or up to 50 nm.

If desired, a relatively thin electrode, in particular an electrode layer, such as an electrode (layer) with a thickness of 15 nm or less, or 10 nm or less, may be provided.

Further, it is surprisingly found possible to use electro-deposition to provide an electrode on an organic electronic device, without an unacceptable detrimental effect on the organic electro-active material, as a result of adverse electro-chemical processes which one may expect to take place during electro-deposition.

A method of the invention may advantageously be employed under mild conditions, such at a relatively low temperature, which allows an electrode to be applied to a temperature sensitive material.

A method of the invention does not need to be carried out in a vacuum. It may in particular suitably be carried out in atmosphere of an inert gas. Examples of inert gases are nitrogen and noble gases (such as helium, neon, argon), including mixtures of nitrogen and one/or more noble gases.

Further, a method of the invention generally shows a low sensitivity towards pinhole formation, compared to, e.g., a vacuum deposition based process, wherein dust particles in the environment may contribute to pinhole formation.

An advantage of a method according to the present invention is that an electrode can be applied onto a large surface by means of, for instance, a roll-to-roll deposition process. In particular a roll-roll process is highly suitable for a continuous process.

Moreover, the method generally does not require to be operated by highly skilled personnel. It can be carried out in a relatively simple manner. In particular, a method of the invention may be carried out using relatively simple equipment, without needing a high investment, in particular compared to vacuum deposition technologies.

Figure 1:
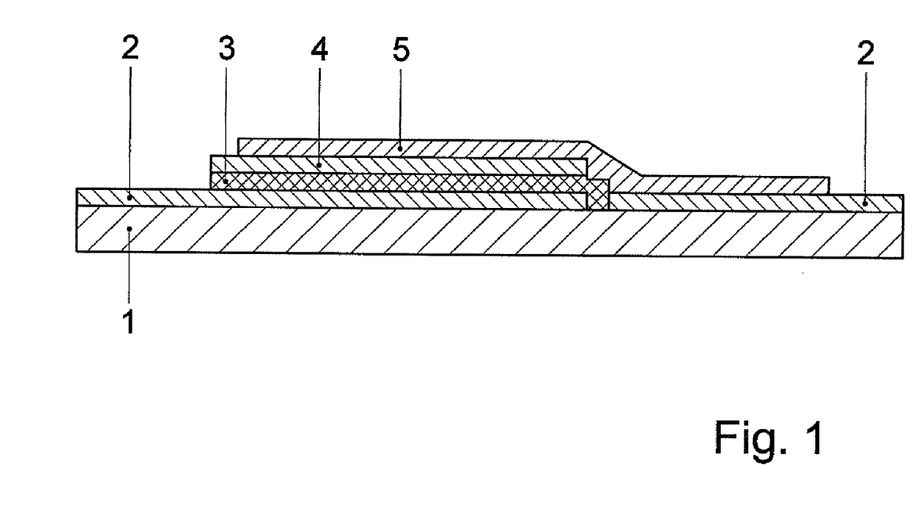
FIG. 1, schematically shows a organic electronic device of the invention.

Organic electronic devices, as used herein are devices, usually comprising, an a first electrode 2 (usually an anode), a second electrode 5 (usually a cathode), and an electro-active layer 3, of which at least an electro-active layer comprises a electro-active organic compound, for instance an electro-active polymer. The compound may be photo-active, capable of converting electrical energy into mechanical energy and/or capable of converting mechanical energy into electrical energy.

A first electrode 2, an electro-active layer 3 comprising the electro-active organic compound, and an electrode 5 are usually applied on a substrate. In particular in case of an opto-electronic device, such as a LED, a photo-voltaic cell or solar cell, at least the cathode may advantageously be divided in at least two sub-layers, a layer comprising a low work function metal and a layer comprising a conductor metal, wherein the layer comprising a low work function metal is positioned in between the layer comprising the conductor metal and the electro-active layer. At least one of these is formed by electro-deposition in accordance with the invention.

One or more other layers may be present, such as an (organic) conducting layer 4 (also referred to a buffer layer), between an electrode, in particular cathode, and organic electro-active material. Suitable conducting layers are, for instance, poly(ethylene dioxythiophene)/poly(styrene-sulphonate) (PEDOT/PSS) or polyaniline (PANI).

Further functional layers for the electronic device, such as one or more functional layers selected from the group of barrier layers, planarisation layers, etcetera, may be applied. The layers may be carried out in a manner known per se, e.g. as described in US 2002/0113548, WO 2005/001945, WO 2005/015173, WO 03/026011, WO03/022581 or WO 02/082561, with the proviso that at least one of the electrodes, preferably at least the cathode, is applied by electro-deposition in accordance with the present invention. In principle, the anode may be applied by electro-deposition. However, suitable substrate foils providing with a transparent conductive oxide which may serve as the anode are commercially available.

The thickness of the layers can be chosen within wide ranges, e.g. within the ranges described in the prior art identified herein. In particular for organo-optical devices wherein a thin and/or flexible device is desired, the layer thickness of one or more of the layers may be advantageously chosen within the following ranges:

substrate 1: 0.01-20 mm, in particular 0.01-5 mm, more in particular 0.01-2 mm;

anode 2: 50-1000 nm;

organic electro-active layer 3: 30-300 nm, in particular 70-200 nm;

(organic) conductor layer: 50-400 nm, in particular 75-150 nm;

The cathode may in particular comprise a low work function metal layer of at least 1 nm, preferably up to 15 nm, in particular up to 10 nm, more in particular up to 5 nm; and a conductor metal layer (such as aluminium) 11-1000 nm, in particular 50-1000 nm In particular in case the cathode should be transparent, the low work function metal layer (preferably barium) preferably has a thickness of up to 5 nm and the conductor metal layer preferably has a thickness of 11-65 nm. In a particularly preferred embodiment for a transparent cathode, the conductor metal layer comprises an aluminium sub-layer (adjacent to the low work function metal layer) upon which a silver layer is provided. The aluminium layer preferably has a thickness of 1-15 nm, the silver layer preferably has a thickness of 10-50 nm.

In an embodiment, the electro-active device is an organic photodiode, such as a polymeric, photodiode. An organic/polymeric photodiode is herein understood to mean a photodiode of which an active layer comprises at least one (semi) conductive organic compound (including a composition thereof), and of at least one (semi)conductive organic polymer (including a composition thereof), respectively. The photodiode preferably comprises an electron-donating organic material (p-type material) and an electron-accepting organic material (n-type material). The photodiode can comprise as active layer a material (such as a conductive polymer) which exhibits photoconduction when it is under an electric potential.

The photodiode may be a photovoltaic cell, which, without an electric potential present, exhibits photoconduction and is capable of converting photon energy into electric energy. Thus, it may be used as a solar cell. In a photovoltaic cell, as electron-donating material and preferably also as electron-accepting material, an organic compound, more preferably an organic polymer, is present. Electron-donating and electron-accepting material can be mixed or be present in separate layers.

In an embodiment, the electro-active material is a polymer selected from the group of polyarylene compounds, poly (paraphenylene vinylene) compounds, polyfluorene compounds, polyacetylene compounds, polythiophene compounds, polypyrroles, polyanilines, including derivatives of said polymers (in particular alkyl, aryl and alkoxy derivatives), copolymers of said polymers and said polymers which have been derivatized with a dye In a photovoltaic cell, such polymers have been found very suitable as electron-donating compound. The photoactive layer which comprises a fullerene and/or a fullerene derivative (e.g. PCBM), as electron-accepting compound.

In the case of an organic light emitting diode (OLED), the electro-active layer comprises an electroluminescent compound. An organic light emitting diode (hereinafter OLED) is herein understood to mean a light emitting diode whose photoactive layer consists at least substantially of at least one (semi)conductive electroluminescent organic compound or composition. A polymeric light emitting diode (hereinafter called PLED) is herein understood to mean a light emitting diode whose photoactive layer consists at least substantially of at least one (semi)conductive electroluminescent organic polymer (including polymer mixtures) or at least one (semi) conductive organic polymer (including polymer mixtures) and at least one other organic compound (for instance a single compound), which is electroluminescent.

Preferred electroluminescent compounds are polyarylenes, more preferably poly(paraphenylene vinylene) compounds (PPV compounds), polyacetylenes, polyanilines, polythiophenes, polyfluorenes, polyvinylcarbazoles, polyphenylene compounds polyfluorene compounds polypyrroles, polyanilines, including derivatives of these polymers (in particular alkyl, aryl and alkoxy derivatives), copolymers of these polymers and mixtures thereof.

Besides a polymer (which term as used herein includes "oligome") a non-polymeric electroluminescent compound may be used, such as a non-polymeric electroluminescent dye. Examples of such compounds are monomers and other non-polymerized molecules with conjugated bonds. Often, such compounds have a relatively low molecular weight compared with polymers, for instance a molecular weight of 100-20,000 g/mol.

With regard to the non-polymeric dyes, inter alia, a compound according to Formula I may be used.

Formula I wherein each $R_1$, $R_2$, $R_3$ and $R_4$ are preferably each selected independently from the group of:
H
branched and unbranched alkyl groups of the formula
—$C_aH_{2a+1}$,
branched and unbranched alkoxy groups of the formula
—O—$C_aH_{2a+1}$,
aryl groups (optionally substituted with one or more alkyl groups and/or one or more alkoxy alkyl groups, preferably of the formula —$C_aH_{2a+1}$, and —O—$C_aH_{2a+1}$, respectively, as described above), preferably aryl groups having 6 to 12 carbon atoms in the ring structure
C≡N
Herein "a" is preferably chosen in the range of from 1 to 20 and more preferably in the range of 2-10.

In a preferred embodiment, the OLED has at least two maxima. An OLED with more than one maximum can be provided for in that the OLED contains at least one electroluminescent active layer which comprises at least two different electroluminescent functionalities. Thus, for instance, the photoactive layer can contain a mixture of two different electroluminescent compounds. Examples include mixtures of the polymers mentioned herein, mixtures of the polymers mentioned herein with other electroluminescent compounds, for instance non-polymeric conjugated compounds, and copolymers with different electroluminescent segments. Suitable examples thereof are described in WO 2005/001945, of which the contents with respect to the suitable electroluminescent compounds are incorporated herein by reference, in particular the part from page 10 line 10 to page 14, line 17.

In an embodiment, the electronic device is an actuator for converting between electrical and mechanical energy. Suitable examples thereof are e.g. described in the yet to be published European patent application 06076435.4 and in the yet to be published European patent application 06075808.3. The actuator may in particular comprise at least one polymer selected from the group of polyvinyl chlorides, polysaccharides, aromatic urethanes, aromatic urethane acrylates, (alkyl)acrylates, (alkyl)methacrylates, acrylonitrile polymers, polysaccharide derivatives (such as starch acetate, cellulose (tri)acetate), polyethers, polyvinylpyrrolidone, polyethyloxazoline and polyvinylidene fluoride.

In an embodiment, the actuator comprises an electro-active polymer which comprises aromatic moieties in the chain and flexible moieties in the chain, the polymer further comprising side groups bound to the chain, which side groups are selected from the group consisting of polar side groups and side groups comprising an aromatic moiety. Said flexible moieties of the polymer may in particular be selected from the group of (cyclo)aliphatic ether moieties, (cyclo)aliphatic ester moieties, (cyclo)aliphatic thioether moieties and (cyclo)aliphatic thioester moieties. Said aromatic moieties in the chain and—when present—in the side groups may in particular be selected from unsubstituted and substituted aromatic moieties having 6-20 carbon atoms; and/or the side groups may comprise a moiety selected from the group consisting of —OH, —CN, —$NH_2$, —$NO_2$, aryloxy, phenyl, halogens, —COOH, NHR, NRR, —(CO)($NH_2$), —(CO)(NHR) and —(CO)(NRR), wherein each R is the same or a different C1-C6 substituted or unsubstituted alkyl group.

In an embodiment, the actuator comprises an electro-active polyurethane-(meth)acrylate copolymer comprising aromatic urethane units and (alkyl)acrylate units, wherein preferably
at least part of (alkyl)acrylate units are based on a monomer represented by formula II Formula II wherein
$R_1$ is hydrogen, an optionally substituted alkyl (in particular methyl) or a polar moiety;
$R_2$ is a polar moiety, an aromatic moiety (in particular a moiety comprising a phenyl), an optionally substituted alkyl or hydrogen;
provided that at least one or $R_1$ and $R_2$ is a polar moiety or an aromatic moiety; and/or wherein preferably at least part of the aromatic moieties in the chain are selected from the group of toluenediisocyanates and methylene diphenyl isocyanate.

Electrochemical deposition (also called electro-deposition or electroplating) of metals and metalloids, including alloys thereof, involves the reduction of ions from an electrolyte solution. The technique is well-known for deposition of various metals and metalloids. In electro-deposition the substrate is placed in a suitable electrolyte containing the ions of the metal or metalloid to be deposited. The substrate must have an electron conductive layer which forms the cathode which is connected to the negative terminal of a power supply. The positive terminal is connected to a suitable anode. The thickness of the deposited layer is a function of the number of electrons (charge) used in the electro-deposition process.

Electro-deposition from aqueous solutions is only possible for providing a layer of a metal or metalloid having a sufficiently high standard potential (also known as Nernst potential). The standard potential of the metal or metalloid should be higher than the standard potential of water to hydrogen, or the kinetic for the reduction of water to hydrogen at the surface of the metal or metalloid should be so slow that the metal can be plated even if its standard potential is below 0 Volt. For instance the noble metals and copper are examples of the first category, while zinc, chromium and cadmium are within the second category of metals that can be plated from an aqueous solution.

However, an aqueous solution is in general not suitable or at least not practical for deposition of a metal or metalloid with a low standard potential, e.g., an alkaline earth metal (such as barium or calcium) or aluminium. The invention allows the use of a non-aqueous system, and thus also allows the use of electro-deposition for providing an electrode comprising one or more of such metals.

Prior to the plating, the material upon which the electrode is to be formed may be pre-treated in a manner known in the art for electro-plating. In particular contaminants and/or films may be removed from the substrate. The pre-treatment may in particular comprise a chemical cleaning step, such as an electro-chemical cleaning step and or a physical cleaning step. Suitable pre-treatment steps are known in the art, and are, e.g, described in Dexter D. Snyder "Preparation for Deposition", chapter 23 in M. Schlesinger, M. Paunovic (eds), "Modern Electroplating", Electrochemical Society Series, 4$^{th}$ Edition, 2000, John Wiley & Sons, New York.

The voltage/current during the electro-deposition process may be performed at galvanostatic control (current control), potentiostatic (potential control, using the potential difference over the substrate and a reference electrode, or at cell voltage control (i.e. wherein the potential over the substrate and anode (counter electrode) is controlled.

Parameters that can be controlled to adjust one or more properties of the formed electrode include cell voltage, cathode potential, and current conditions. More specifically, by choosing the duration of the electro-deposition and total charge (coulombs) applied for the duration of the electro-deposition, and in particular by choosing the applied current and/or potential, one or more properties can be influenced.

In an embodiment, the electro-deposition is accomplished using an essentially constant current, an essentially constant potential over the material upon which the metal or metalloid is deposited and a reference electrode, or a constant cell voltage.

However, it may be advantageous with respect to providing an electrode with an improved property, such as improved smoothness and/or homogeneity, to change current and/or potential a plurality of times between at least one first value (A) and at least one second value different from said first value (B).

It is observed that in a method of the invention it is possible to first apply value A and thereafter value B or vice versa.

Typically, at least one of the values A respectively B is equal to or higher than the standard potential of the metal/metalloid ion which is to be reduced and deposited to form the electrode.

Thus, the potential and/or current may changed from
A) a potential respectively current being sufficient to cause reduction of the metal ions and/or metalloid ions (to a non-ionic state)—i.e. a reducing potential/current—to
B) a potential respectively current being insufficient to cause reduction of the metal ions and/or metalloid ions—i.e. a non-reducing potential/current—which non-reducing potential/current may be an oxidising potential/current.

It is also possible to change the potential and/or current from
A) a potential having a high absolute value sufficient to cause reduction of the metal ions or metalloid ions, respectively a current through the substrate having a high absolute value sufficient to cause reduction of the metal ions or metalloid ions, to
B) a potential having a low absolute value, yet sufficient to cause the growth of nuclei comprising the metal or metalloid, respectively a current through the substrate having a low absolute value, yet sufficient to cause the growth of nuclei comprising the metal or metalloid.

A suitable potential/current for step A respectively B is dependent upon the metal ions and/or metalloid ions from which the electrode is formed, the material upon which the electrode is formed and conditions such as the temperature.

A non-reducing and a reducing potential respectively current, can be routinely determined based on the standard potential of the specific metal or metalloid, optionally in combination with some routine experimentation.

A non-reducing potential/current may be an oxidising potential/current, i.e. a potential/current sufficient to cause part of the deposited metal/metalloid to be oxidised. An oxidising potential/current may be useful to etch or polish the surface of the deposited metal/metalloid. This may be beneficial to a property of the final electrode.

By selecting the frequency by which the current/potential is changed, duration of the steps A respectively B, value of (absolute maximum of) the current/potential in steps A respectively B and/or slope by which the voltage/current is changed, one or more properties of the electrode to be formed may be influenced.

A non-reducing voltage/current (in step B) may be 0. Accordingly, the cell may be let at the open cell voltage, or at the rest potential for a period of time.

A non-reducing voltage/current (in step B) may have the opposite sign of charge from the (current at the) standard potential. Hereby a part of the deposited metal/metalloid may be re-oxidised and optionally dissolved. Thus, such voltage/current should be such that—on average—reduction and deposition is larger the oxidation and dissolution.

In a method of the invention wherein current/potential is changed a plurality of times, the ratio of the absolute value of the current in step B to the absolute value of the current in step A is less than 1. Usually said ratio is less than 0.9. Preferably said ratio up to 0.8, in particular up to 0.6, more in particular up to 0.5.

The ratio of the current in step B to the current in step A (absolute values) is at least 0.

The current in step B may be an oxidising current (to redissolve part of the deposited metal or metalloid), as long as on average the amount of redissolved metal or metalloid is less than the amount of deposited metal or metalloid. It is also possible to change between a high reducing current and a low reducing current, wherein the low reducing current can be advantageous to allow growth of nuclei of the metal or metalloid.

The frequency of changing the potential/current can be chosen within wide limits. The frequency may be essentially constant or varied.

Usually, the average frequency of the changing (to get from a first reducing potential/current to the next reducing potential/current) is at least 0.01 Hz, in particular at least 0.1 Hz or at least 1 Hz. The average frequency of the changing is usually up to 10 KHz, in particular up to 1 KHz or up to 500 Hz.

The number of changes (the number of cycles from a step A to the next step A, or the number of cycles from a step B to the next step B) may be chosen within wide limits, depending upon factors, such as the desired amount of deposition (such as the desired layer thickness), the current density applied, the frequency, the deposition efficiency, the optional use of an etching potential/current. The skilled person will be able to determine a suitable number, based upon the information disclosed herein, common general knowledge and optionally some routine testing. In case a method is used wherein the current/potential is changed a plurality of times, the number of changes from A to B or B to A usually is more than 2, and in particular it may be at least 5, at least 10 or at least 25.

The upper limit is determined by reaching the target deposition (such as reaching a specific thickness of the electrode). It may for instance be up to 1000, up to 100 000 or up to 1 000 000. However a higher number of changes is in principle allowed, in particular in case the changing frequency is high.

FIG. 2A-C shows a number of ways by which the current/potential can be changed. It will be understood that other possibilities may be employed, e.g. two or more of the ways of changing may be combined. Herein, Level II is a reduction current/potential at which deposition takes place. Level I can be a) a 0 current or rest potential (open circuit potential); b) an anodic current/potential at which a part of the previously deposited metal or metalloid may be (oxidised and) dissolved; c) a relatively low reduction current/potential (compared to Level II) which may be used to grow metal/metalloid nuclei, which are formed in a previous Level II current/potential. In these Figures, $t_1$ is the cycle time from a first Level I to the next (the reciprocal of the frequency), $t_2$ the duration of the current/potential at level II, $t_3$ the duration at level I, and $t_4$ respectively $t_5$ the time to change from (an extreme) current/potential from one level to the other, in case the current/voltage change is effected with a specific slope. The ratio of $t_2/t_1$ may be chosen within wide limits. A relatively high ratio may be advantageous from a processing time of view. The ratio $t_2/t_1$ may in particular be at least 0.001, at least 0.01, or at least 1. The ratio $t_2/t_1$ may in particular be up to 1000, up to 100 or up to 10.

In an embodiment of the invention, the changing comprises applying current/potential pulses, e.g. as shown in FIG. 2A. Herein, the current/potential is changed essentially instantaneously.

In an embodiment, the change from a first current/potential to another takes places at a specific rate, e.g. as shown in FIG. 2B.

In an embodiment, the changing comprises applying current/potential in an undulating way, for instance by a sinusoidal change, e.g. as shown in FIG. 2C.

Further, the temperature may be controlled. Typically, the temperature is at least above the melting temperature of the ionic liquid/salt system. For practical reasons, the temperature is preferably at least ambient temperature, such as at least 20° C. or at least 25° C. An elevated temperature, e.g. of at least 30° C., at least 40° C. or at least 50° C. may be chosen in case a plating liquid to be used is not sufficiently liquid at ambient temperature. A relatively high temperature is usually advantageous for achieving a relatively low viscosity and/or a improved electrical conductance of the liquid.

Usually the temperature is up to 200° C. For practical reasons, it may be preferred that the temperature is up to 100° C., up to 70° C. or up to 50° C., in particular in case a material upon which the electrode is deposited comprises a compound that is not sufficiently thereto-stable at a higher temperature.

Further, electro-deposition may be carried out with or without convection of the liquid, for instance with or without agitation. Convection is considered advantageous in order to avoid or at least reduce the occurrence of a possibly detrimental concentration gradient of the ions to be deposited at the cathode.

The plating liquid comprises an ionic liquid. An ionic liquid is a liquid formed of a salt that is liquid under the process conditions, such as a melt of a salt; thus the temperature and pressure under processing conditions are such that the salt per se is in a liquid state of matter. In general an ionic liquid used in a method of the invention, has a melting point below 200° C., preferably of 100° C. or less, in particular of 50° C. or less. It is in particular preferred that the ionic liquid is liquid at about 20° C. or at about 25° C. Such liquid may be referred to as a room temperature liquid salt.

Salts that form an ionic liquid are known in the art. For instance, U.S. Pat. No. 4,764,440 discloses a composition comprising a mixture of a metal halide and a hydrocarbyl-saturated onium salt, wherein at least one of the hydrocarbyl groups is an aromatic hydrocarbyl group. The contents of this publication with respect to the description of suitable ionic liquids, in particular as specified in the claims thereof is incorporated herein by reference. U.S. Pat. No. 5,731,101 discloses an ionic liquid composition comprising a mixture of a metal halide and an alkyl-containing amine hydrohalide salt of the formula $R_3N.HX$, where at least one R is alkyl and X is halogen, which amine hydrohalide salt contains either one or two alkyl groups therein. The contents of this publication with respect to the description of suitable ionic liquids, in particular as specified in the claims thereof is incorporated herein by reference.

U.S. Pat. No. 5,892,124 discloses liquid salts of the general formula $Q^+A^-$, wherein $Q^+$ represents quaternary ammonium or phosphonium, and $A^-$ represents various anions including tetrachloroaluminate and trichlorozincate. The contents of this publication with respect to the description of suitable ionic liquids, in particular as specified in the claims thereof is incorporated herein by reference.

In particular suitable is an ionic liquid selected from the ionic liquids described in WO 02/26381, of which the contents of this publication with respect to the description of suitable ionic liquids, in particular as specified in the claims thereof is incorporated herein by reference. Such ionic compound can be formed by the reaction of at least one amine salt of the formula $R^1R^2R^3R^4N^+X^-$ (I) with at least one hydrated salt, which is a chloride, nitrate, sulphate or acetate of Li, Mg, Ca, Cr, Mn, Fe, Co, Ni, Cu, Zn, Cd, Pb, Bi, La or Ce; wherein $R^1$, $R^2$ and $R^3$ are each independently a $C_1$ to $C_5$ alkyl or a $C_6$ to $C_{10}$ cycloalkyl group, or wherein $R_2$ and $R_3$ taken together represent a $C_4$ to $C_{10}$ alkylene group, thereby forming with the N atom of formula I a 5 to 11 membered heterocyclic ring, and wherein $R^4$ is hydrogen, or phenyl, or a $C_1$ to $C_{12}$ alkyl or cycloalkyl group, optionally substituted with at least one group selected from OH, Cl, Br, F, I, phenyl, $NH_2$, CN, $NO_2$, $COOR^5$, CHO, $COR^5$ and $OR^5$, wherein $R^5$ is a $C_1$ to $C_{10}$ alkyl or cycloalkyl group, and $X^-$ is an anion capable of being complexed by the said hydrated salt, for instance a halogen ion, such as $Cl^-$ or $Br^-$.

In an embodiment, the ionic liquid comprises a salt of the following cations and/or anions:

cations selected from the group of monosubstitued imidazolium compounds, disubstituted imidazolium compounds, trissubstitued imidazolium compounds, pyridinium compounds, pyrrolidinium compounds, phosphonium compounds, ammonium compounds, guanidinium compounds and isouronium compounds, including combinations thereof. The substituents may in particular be selected from the substituents described above, when referring to $R^1$-$R^5$ in the amine salt of the formula $R^1R^2R^3R^4N^+X^-$ (I).

anions selected from the group of chloride, bromide, iodide, nitrate, nitrite, fluoride, phosphate, imide, amide, borate, tosylate, tetrafluoroborate, hexafluoroborate, hexafluorophosphate, trifluoromethanesulfonate, methylsulfate, bis(pentafluoroethyl)phosphinate, thiocynate, octylsulfate, hexylsulfate, buthylsulfate, ethylsulfate, dicyanamide, hexafluoroantimonate, bis-(pentafluoroethyl)phospinate, bis-(trifluoromethyl)imide, trifluoroacetate, bis-trifluorsulfonimide, triflate and dicyanamide, including combinations thereof.

The plating liquid may comprise a solvent, solvents being materials other than the liquid salt which are liquid under the conditions at which the method is carried out. In particular, the solvent may be chosen from inorganic solvents other than water and organic solvents, such as benzene or an alcohol.

The solvent concentration will usually be less than 25 wt. %, based on total liquid salt, in particular 20 wt. % or less, more in particular 15 wt. % wt or less. Preferably, the solvent concentration is up to 2 wt. % based on total liquid salt, more preferably less than 1 wt. %.

In general it is preferred that the plating liquid is essentially free of water and/or other solvents. A plating liquid is in particular considered to be essentially free of a solvent if the concentration of that solvent is less than 0.5 wt. %, based on total liquid salt, more in particular less than 0.1 wt. % of a solvent, or less than 0.01 wt. %. In particular, it is contemplated that the (essential) absence of water during the plating may be beneficial to the life-time of the organic electronic device.

A maximum desired water level (in view of efficiency and/or effectivity) depends on the metal to be deposited. In case the standard potential is higher than the standard potential of water to hydrogen (e.g. Ag, Au, Cu . . . )), then the water concentration is preferably 0.1 wt. % or less. In particular, in case the standard potential is equal to or less than the standard potential of water to hydrogen (e.g. Al, Ba, Li) then a water content of less than 10 ppm, in particular of 1 ppm or less is desired.

The metal/metalloid ions for forming the electrode, may in particular be any metal ion or metalloid ion that can be reduced from ionic state to non-ionic state (atomic state) and form a (semi-conductive) deposition. The ions may all be of the same metal or metalloid, or a combination of two or more ions selected from the group of metal ions and metalloid ions may be used.

A metallic electrode as used herein is an electrode comprising one or more metals, thus the term includes depositions of a metallic alloy. In particular an electrode is considered metallic if it shows metallic electrical conductance.

The ions to be deposited may be all ions of the same metal or metalloid. It is also possible to deposit ions from different metals/metalloids. In particular, ions to be deposited may be selected from ions of metals selected from the group of low work function metals and/or from ions of metals selected from the group of conductor metals.

Low work function metals are metals having an ionisation potential, of less than 4.5 eV. Preferably one or more low work function metal ions are used selected from the group of ions of lithium, calcium, barium, magnesium, ytterbium, gold and silver. In a particularly preferred embodiment, at least one metal ion selected from the group of lithium ions and barium ions is deposited.

Conductor metals are metals having a low electrical resistance, in particular of less than $10^{-5}$ ohm/m. Preferably one or more ions are used of conductor metals selected from the group of aluminium, copper, gold and silver. Of these, good results have in particular been achieved with aluminium. Silver may in particular be advantageous for providing a transparent layer. Silver has a high conductivity compared to aluminium. Thus, it can advantageously be applied in a conductive layer thin enough to be transparent, whilst obtaining a silver layer with a good conductivity. In case silver or another noble metal is to be deposited on an organic electro active material, in particular an organic semi-conductive material, it is preferred to first deposit a (thin) layer of a alkaline or alkaline earth metal, such as Ba, Li or Ca, on the organic material, upon which in turn the noble metal is deposited. Such intermediate layer acts to improve the interaction of the noble metal with the organic material.

Preferably, the electrode comprises a conductor metal and a low work function metal, different from the conductor metal. Preferably, the conductor metal and the low work function metal are deposited as separate layers, wherein the low work function metal is most adjacent to the electro-active material.

In principle, it is also possible to provide an electrode comprising a metalloid. Metalloids are elements that are generally not considered real metals, but that do show more or less metallic behaviour in one or more specific aspects. In particular, metalloids are capable of conducting electricity, to the extent that they are semiconductors rather than metallic conductors. In particular, Boron (B), Silicon (Si), Germanium (Ge), Arsenic (As), Antimony (Sb), Tellurium (Te) and Polonium (Po) are examples of metalloids.

A metalloid electrode as used herein is an electrode comprising one or more metalloids, thus the term includes electrodes comprising a metalloid alloy. In particular an electrode is considered a metalloid electrode if it shows metalloid electrical conductance (i.e. showing semi-conductive properties, such as a semi-metal).

The counter ions of the metal ions or metalloid ions used for deposition may be the same or different from the cations of the ionic liquid. In particular the counter ions may be chosen from the group of chloride, bromide, iodide, nitrate, nitrite, fluoride, phosphate, imide, amide, borate, tosylate, tetrafluoroborate, hexafluoroborate, hexafluorophosphate, trifluoromethanesulfonate, methylsulfate, bis(pentafluoroethyl)phosphinate, thiocynate, octylsulfate, hexylsulfate, buthylsulfate, ethylsulfate, dicyanamide, hexafluoroantimonate, bis-(pentafluoroethyl)phospinate, bis-(trifluoromethyl)imide, trifluoroacetate, bis-trifluorsulfonimide, triflate and dicyanamide, including combinations thereof.

In an embodiment of the invention, a deposition (such as a layer) of an alloy is formed by using co-deposition. This may be achieved by using a single plating liquid comprising more than one type of ions to be deposited on the substrate, to allow co-deposition to take place in a single electro-deposition process.

In an embodiment, the different ions to be deposited are dissolved in separate plating liquids, with which the substrate is sequentially contacted under plating conditions. This allows the formation of different layers on top of each other.

The total concentration of the salt comprising the ions for forming the electrode preferably is at least 0.1 mol %, more preferably at least 1 mol %, even more preferably at least 5 mol %, or at least 10 mol %. A relatively high concentration is in particular advantageous in order to allow a high deposition speed.

The upper limit is in particular determined by the maximum allowable concentration in order to maintain the plating liquid in a liquid state (the saturation level). A relatively high concentration usually advantageous for a high deposition rate. Also a large amount of ions can usually be reduced and deposited before depletion of the liquid may become noticeable. Also the presence of the ions to be deposited in a relatively high concentration may be advantageous for improved liquidity (reduced viscosity, reduced melting temperature of the liquid), and/or improved electrical conductance.

The total concentration of the salt of the metal/metalloid ions for forming the electrode preferably is up 70 mol %, more preferably up to 65 mol %, in particular up to 60 mol %. For practical reasons, e.g. reaching saturation in the liquid, a lower concentration may be chosen, e.g. up to 40 mol %, up to 20 mol %, up to 10 mol %, or 5 mol % or less.

In an advantageous embodiment, a "sacrificial electrode" is used as a counter electrode (anode). At least the surface of such an electrode comprises the same metal or metalloid as the metal or metalloid that is to be deposited. While the metal or metalloid is deposited on the substrate during electrodeposition, metal/metalloid at a surface of the sacrificial electrode will be oxidised and dissolve in the plating liquid. Thus, the composition of the plating liquid can be maintained at about the same concentration for a prolonged timed, or at least depletion of the liquid with metal/metalloid ions can be postponed. Such electrode may for instance be a plate, foil or thread of the metal/metalloid to be deposited, e.g. an aluminium counter electrode can be used when depositing aluminium on a substrate form a aluminium ions containing ionic liquid electrolyte.

In an advantageous embodiment, at least part of the electrodeposition is carried out while the surface of the electroactive material, in particular an organic semi-conductive material, or a part thereof is exposed to electromagnetic radiation. The wavelength of the electromagnetic radiation is typically of a high enough energy to overcome the band gap of the organic semiconductive material on which the metal or metalloid is deposited. Hereby the deposition is aided and a smaller electric potential is required to achieve deposition. Hereby the risk of adversely affecting a property of the organic electro-active material is reduced. Further, it is envisaged by the inventors that such irradiation is in particular useful to provide a more homogenous deposition and/or a more dense deposition (within the deposition formed on the irradiated surface). Furthermore, it is contemplated that such irradiation may help to reduce the occurrence of pinholes.

Figure 2:
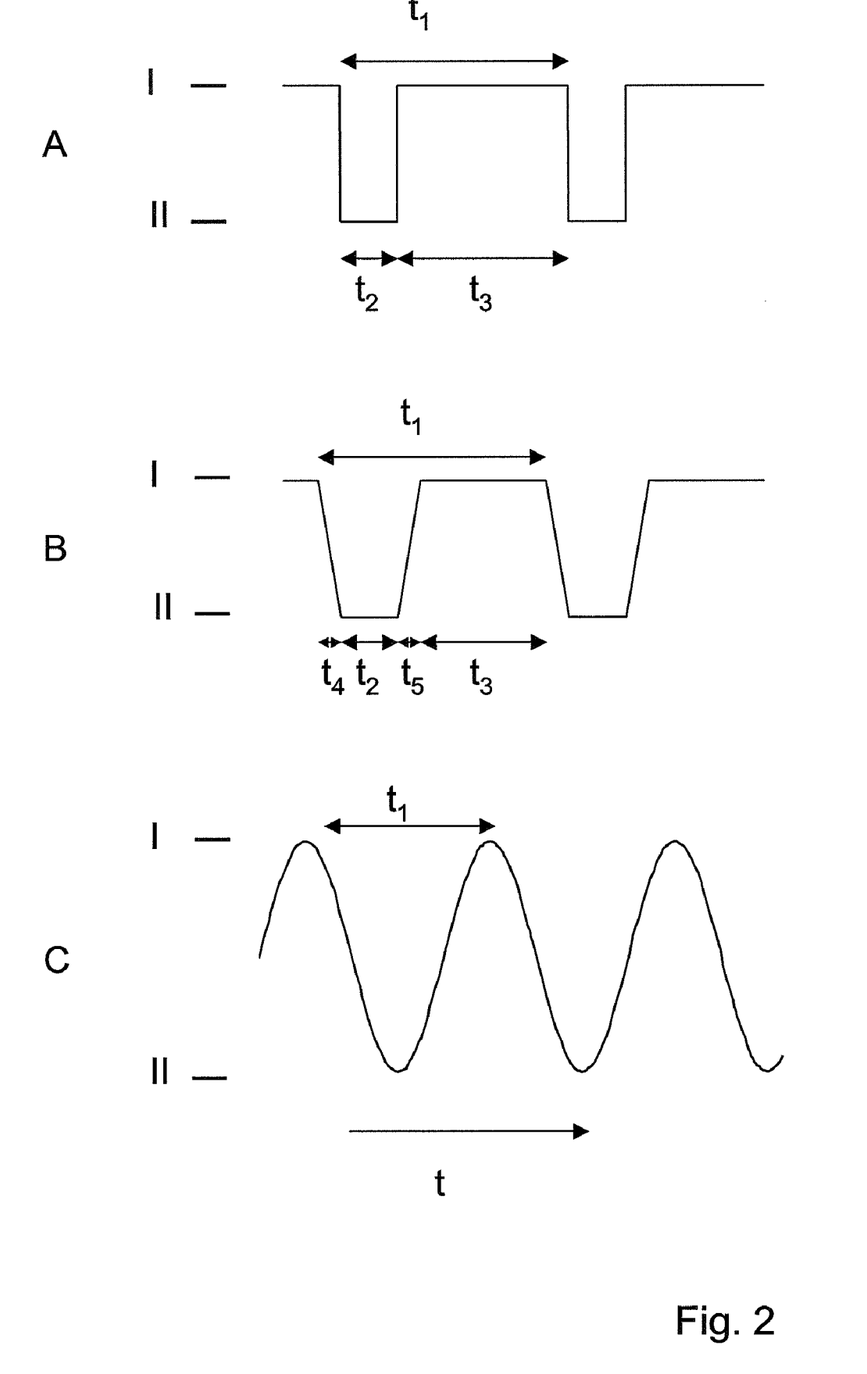
FIG. 2, schematically shows a number of ways wherein current and/or potential can be applied.
Figure 3:
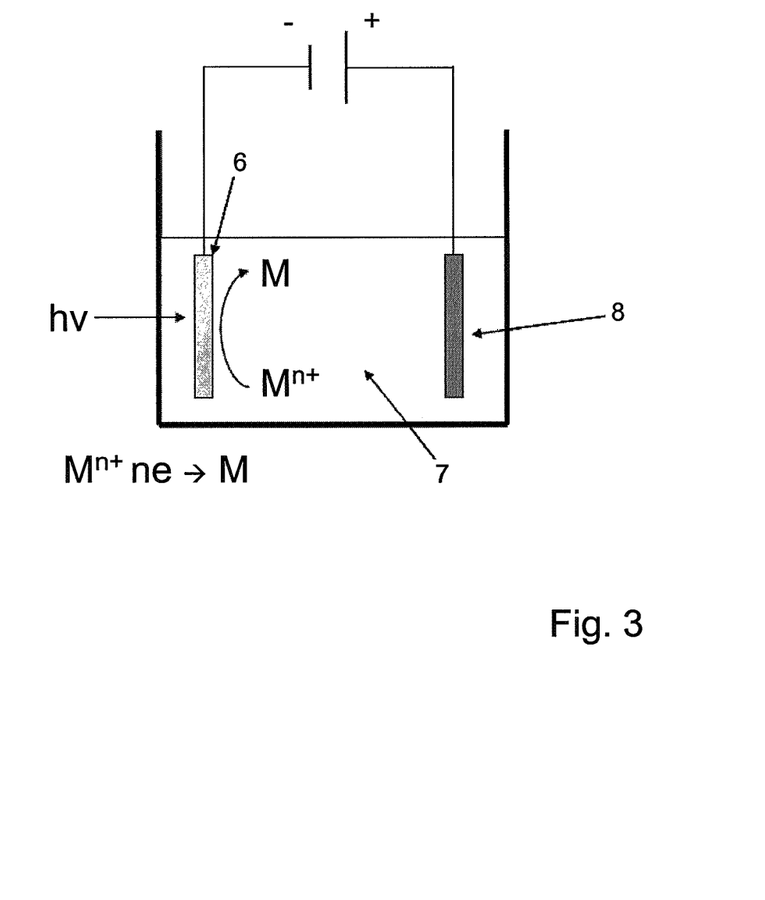
FIG. 3, schematically shows a set-up of an embodiment of the invention wherein electromagnetic radiation is used.
Figure 4:
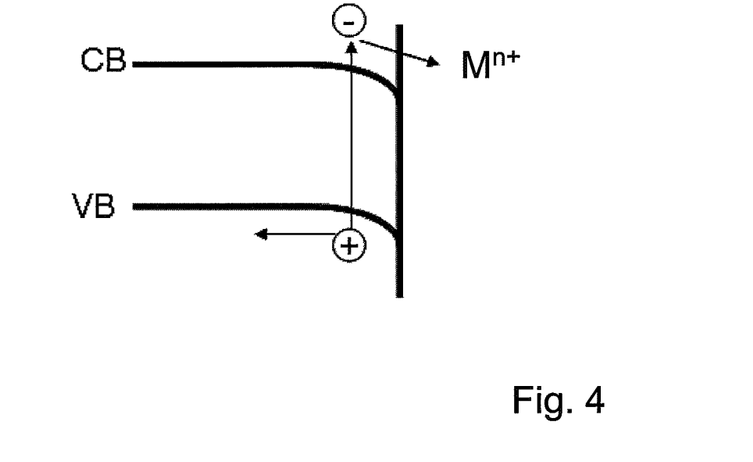
FIG. 4, schematically shows a diagram illustrating the band gap and valence gap of a material.

This embodiment is schematically illustrated in FIGS. 3 and 4. FIG. 3 shows a schematic representation of the method. The substrate 6 with the semiconductor layer is doped in the ionic liquid 7 containing the metal-ions or metalloid ions $M^{n+}$ (e.g. $Al^{3+}$) which are to be deposited. Counter electrode 8 may be made of any suitable material, e.g. as described herein, in particular it may be a electrode of which at least the surface comprises metal or metalloid M. To deposit the metals the semiconductor layer is irradiated with electromagnetic radiation (hv). By applying a small reverse potential to the semiconductor the electron-hole pair, created by the photons, can be separated. The holes in the valance band (VB) will be drawn to the back contact on the substrate, while the electron in the conduction band (CB) will be brought to the interface with the ionic liquid (FIG. 2). At the interface the electrons can be used to reduce the metal ions or metalloid ions in solution. This way a metal layer or a metalloid layer can be deposited on the semiconductor layer.

The irradiation can be performed homogeneously over the semiconductor layer or the irradiation can be applied locally, to achieve localised metal deposition. By applying electromagnetic irradiation locally a patterned electrode having a desired shape can be provided. To this purpose use may be made of a LASER and/or a mask.

The wavelength of the electromagnetic radiation may usually be chosen in the infrared, visible or ultraviolet range. A suitable wavelength and intensity of the electromagnetic radiation for the deposition of a specific metal or metalloid may be determined based on known values for the bandgap of a specific material and/or be determined empirically making use of common general knowledge and the information disclosed herein.

The plating liquid may further comprise one or more additives, such as a brightener and/or a surface active agent. One or more additives are optionally also deposited. Suitable conditions for the additives are e.g. described in "Effect of additives", Chapter 10 in M. Schlesinger, M. Paunovic (eds), "Fundamentals of Electrochemical Deposition", Electrochemical Society Series, 2nd Edition, 2006, John Wiley & Sons, New York, of which Chapter the contents are incorporated by reference.

After forming the electrode, the device may be subjected to one or more post-treatment steps. For instance, excess ionic liquid may be removed. One or more further steps, such as the provision of one or more other functional layers, which may be employed are, e.g., described in the above identified prior art.

The invention will now be illustrated by the following example.

EXAMPLE pulsed deposition on glass/ITO/PEDOT/LEP

A substrate of ~1 cm² glass coated with a transparent conducting ITO layer (about 150 nm thickness) which ITO in turn had been provided with a Poly(3,4-ethylenedioxythiophene)poly(styrenesulfonate) (PEDOT) layer (about 100 nm thickness). A 70 nm polyfluorene light emitting polymer layer (LEP) was coated on top of the PEDOT layer. Aluminium was deposited on the LEP layer.

The counter Electrode was aluminium-sheet 99.99% Al~6 cm².

The reference electrode was aluminium-wire diameter 0.5 mm 99.99% Al.

Ionic liquid was 1-Ethyl-3-methyl-imidazoliumchloride (EMImCl, 40 mol %) comprising aluminiumchloride ($AlCl_3$, 60 mol %)

The process conditions were as follows.

A pulsed current was used as schematically shown in FIG. 2A, with $I_1$: 0 mA/cm², $I_2$: −20 mA/cm², 0.2 s, $t_2$: 0.1 s, $t_3$: 0.1 s.

Temperature: 30° C.

Deposition time was 30 seconds (deposition charge t×j=0.3 C/cm² corresponding to a calculated layer thickness of 100 nm)

After deposition the article was visually evaluated: the deposited layer was mat to lustrous and homogenous, also at the edges.

The invention claimed is:

1. Method for manufacturing an organic electronic device, which comprises:
   electro-depositing an electrode to a surface of an organic electro-active material, or to a surface of a substrate after which the organic electro-active material is applied to a surface of the electrode, with a plating liquid including an ionic liquid melt formed from a salt,
   wherein the ionic liquid melt includes metal or metalloid ions reduced to a non-ionic state.

2. Method according to claim 1, wherein the electrode comprises at least one low work function metal and at least one conductor metal, different from the low work function metal.

3. Method according to claim 1, wherein the plating liquid comprises one or more ions selected from the group of lithium, calcium, barium, magnesium, ytterbium, gold, silver and aluminum.

4. Method according to claim 3, wherein a layer comprising the low work function metal is applied to the electro-active layer and thereafter the conductor metal is applied to the layer comprising the low work function metal, and wherein at least one of said metals is applied by electro-deposition.

5. Method according to claim 3, wherein the low work function metal and the conductor metal are applied by electrochemical co-deposition.

6. Method according to claim 1, wherein the electrode is electro-deposited by a roll-to-roll technique.

7. Method according to claim 1, wherein the salt comprises:
   at least one of the cations selected from the group consisting of monosubstitued imidazolium derivates, disubstituted imidazolium derivates, trissubstitued imidazolium derivates, pyridinium derivates, pyrrolidinium derivates, phosphonium derivates, ammonium derivates, guanidinium derivates and isouronium derivates; and
   at least one of the anions selected from the group consisting of chloride, bromide, iodide, nitrate, nitrite, fluoride, phosphate, imide, amide, borate, tosylate, tetrafluoroborate, hexafluoroborate, hexafluorophosphate, trifluoromethanesulfonate, methylsulfate, bis(pentafluoroethyl)phosphinate, thiocynate, octylsulfate, hexylsulfate, buthylsulfate, ethylsulfate, dicyanamide, hexafluoroantimonate, bis-(pentafluoroethyl)phospinate, bis-(trifluoromethyl)imide, trifluoroacetate, bis-trifluorsulfonimide, triflate and dicyanamide.

8. Method according to claim 1, wherein the salt is formed by the reaction of at least one amine salt of the formula $R^1R^2R^3R^4N_+X^-$ (I) with at least one hydrated salt, which is a chloride, nitrate, sulphate or acetate of Li, Mg, Ca, Cr, Mn, Fe, Co, Ni, Cu, Zn, Cd, Pb, Bi, La or Ce; wherein $R^1$, $R^2$ and $R^3$ are each independently a $C_1$ to $C_5$ alkyl or a $C_6$ to $C_{10}$ cycloalkyl group, or wherein $R_2$ and $R_3$ taken together represent a $C_4$ to $C_{10}$ alkylene group, thereby forming with the N atom of formula I a 5 to 11 membered heterocyclic ring, and wherein $R^4$ is hydrogen, or phenyl, or a $C_1$ to $C_{12}$ alkyl or cycloalkyl group, optionally substituted with at least one group selected from OH, Cl, Br, F, I, phenyl, $NH_2$, CN, $NO_2$, $COOR^5$, CHO, $COR^5$ and $OR^5$, wherein $R^5$ is a $C_1$ to $C_{10}$ alkyl or cycloalkyl group, and $X^-$ is an anion capable of being complexed by the said hydrated salt.

9. Method according to claim 1, wherein the electrical potential and/or electrical current are changed a plurality of times between at least one first value (A) and at least one second value different from said first value (B), at least one of said values being sufficient to cause the deposition.

10. Method according to claim 1, wherein the electro-deposition is current controlled.

11. Method according to claim 1, wherein the plating liquid is essentially water-free.

12. Method according to claim 1, wherein the electronic device is selected from the group consisting of organic diodes; organic LEDs; organic photo-voltaic cells; organic actuators for converting mechanical energy to electrical energy or vice versa; organic electrical circuits; and organic transistors.

13. Method according to claim 1, wherein the electrode is deposited on a foil comprising the electro-active material.

14. Method according to claim 1, wherein at least part of the surface upon which the electrode is formed is exposed to electromagnetic radiation.

15. Method according to claim 3, wherein the plating liquid comprises aluminum ions and wherein the electrode that is electro-deposited is an aluminum electrode.

* * * * *